United States Patent [19]
Dennison

[11] Patent Number: 5,909,616
[45] Date of Patent: Jun. 1, 1999

[54] METHOD OF FORMING CMOS CIRCUITRY

[75] Inventor: Charles H. Dennison, Meridian, Id.

[73] Assignee: Micron Technology, Inc., Boise, Id.

[21] Appl. No.: 08/982,781

[22] Filed: Dec. 2, 1997

Related U.S. Application Data

[63] Continuation of application No. 08/810,416, Mar. 4, 1997, Pat. No. 5,721,165, which is a continuation of application No. 08/546,149, Oct. 20, 1995, Pat. No. 5,637,525.

[51] Int. Cl.$^6$ .................................................. H01L 21/8238
[52] U.S. Cl. .......................... 438/232; 438/233; 438/548; 438/564; 438/675
[58] Field of Search ................................... 438/232, 233, 438/548, 564, 199, 674, 675; 257/274, 338, 351

[56] References Cited

U.S. PATENT DOCUMENTS

| | | | |
|---|---|---|---|
| 4,502,210 | 3/1985 | Okumura et al. | 29/591 |
| 4,538,344 | 9/1985 | Okumura et al. | 29/589 |
| 4,714,686 | 12/1987 | Sander et al. | 437/195 |
| 4,727,045 | 2/1988 | Cheung et al. | 437/47 |
| 5,015,594 | 5/1991 | Chu et al. | 437/31 |
| 5,022,958 | 6/1991 | Favreua et al. | 156/643 |
| 5,106,782 | 4/1992 | Matsuno et al. | 437/193 |
| 5,244,835 | 9/1993 | Hachiya | 437/186 |
| 5,449,637 | 9/1995 | Saito et al. | 437/57 |
| 5,489,546 | 2/1996 | Ahmad et al. | 437/34 |
| 5,489,646 | 2/1996 | Ahmad et al. | 437/57 |
| 5,637,525 | 6/1997 | Dennison | 438/232 |
| 5,718,800 | 2/1998 | Juengling | 156/643.1 |
| 5,721,165 | 2/1998 | Dennison | 438/232 |

OTHER PUBLICATIONS

Michel, A.E. et al., "Ion–Implanted Polysilicon Diffusion Sources", Nuclear Instruments and Methods, North–Holland Pub. Co. 1983, pp. 700–724.

Kusters, K.H. et al., "A Self Aligned Contact Process With Improved Surface Planarization", Journal De Physique, No. C4, Sep. 1988, pp. 503–506.

Wolf, Stanley, "Silicon Processing . . . VLSI Era", 1990, pp. 439–440.

Wolf, Stanley, "Silicon Processing . . . VLSI Era", 1990, pp. 224–226.

Wolf, Stanley, "Silicon Processing . . . VLSI Era", 1990, pp. 238–239.

*Primary Examiner*—Peter Toby Brown
*Assistant Examiner*—Long Pham
*Attorney, Agent, or Firm*—Wells, St. John, Roberts, Gregory & Matkin, P.S.

[57] ABSTRACT

A method of forming a field effect transistor includes, a) providing a gate over a semiconductor substrate, the gate having a thickness; b) providing an insulating dielectric layer over the gate, the insulating dielectric layer being provided to a thickness which is greater than the gate thickness to provide an outer dielectric layer surface which is above the gate; c) patterning and etching the insulating dielectric layer to provide openings therethrough to the substrate to define and expose active area adjacent the gate for formation of one of PMOS type or NMOS type diffusion regions; d) providing a layer of conductive material over the insulating dielectric layer and within the openings; e) providing the one of PMOS or NMOS type diffusion regions within the substrate relative to the first openings; and f) etching back the conductive layer to define electrically conductive projections which are isolated from one another within the openings. The method has specific applicability to CMOS fabrication, and provision of overlying and differently conductively doped polysilicon layers which are chemical-mechanical polished in a common step.

4 Claims, 11 Drawing Sheets

5,909,616

METHOD OF FORMING CMOS CIRCUITRY

RELATED PATENT DATA

This patent resulted from a continuation application of U.S. patent application Ser. No. 08/810,416, filed on Mar. 4, 1997, now U.S. Pat. No. 5,721,165 which is a continuation application of U.S. patent application Ser. No. 08/546,149, filed on Oct. 20, 1995, now U.S. Pat. No. 5,637,525.

TECHNICAL FIELD

This invention relates to methods of forming complementary metal oxide semiconductor (CMOS) integrated circuitry, and to methods of forming field effect transistors.

BACKGROUND OF THE INVENTION

An MOS (metal-oxide-semiconductor) structure in semiconductor processing is created by superimposing several layers of conducting, insulating and transistor forming materials. After a series of processing steps, a typical structure might comprise levels of diffusion, polysilicon and metal that are separated by insulating layers.

CMOS is so-named because it uses two types of transistors, namely an n-type transistor (NMOS) and a p-type transistor (PMOS). These are fabricated in a semiconductor substrate, typically silicon, by using either negatively doped silicon that is rich in electrons or positively doped silicon that is rich in holes. Different dopant ions are utilized for doping the desired substrate regions with the desired concentration of produced holes or electrons.

NMOS remained the dominant MOS technology as long as the integration level devices on a chip was sufficiently low. It is comparatively inexpensive to fabricate, very functionally dense, and faster than PMOS. With the dawning of large scale integration, however, power consumption in NMOS circuits began to exceed tolerable limits. CMOS represented a lower-power technology capable of exploiting large scale integration fabrication techniques.

CMOS fabrication does however present a number of challenges to the fabricator as compared to using PMOS or NMOS alone. Specifically, typically independent or separate masking steps are utilized for masking one of the p-type regions while the n-type region is being doped. Also, the n-type regions are separately masked when the p-type regions are being doped. Accordingly, typical transistor flows use one mask each to form the n-channel and p-channel transistor source and drain regions. Higher levels of integration result in denser and denser circuits, leading CMOS fabrication to more difficulties.

It would be desirable to develop methods which further facilitate formation of complementary source and drain regions within a semiconductor substrate.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
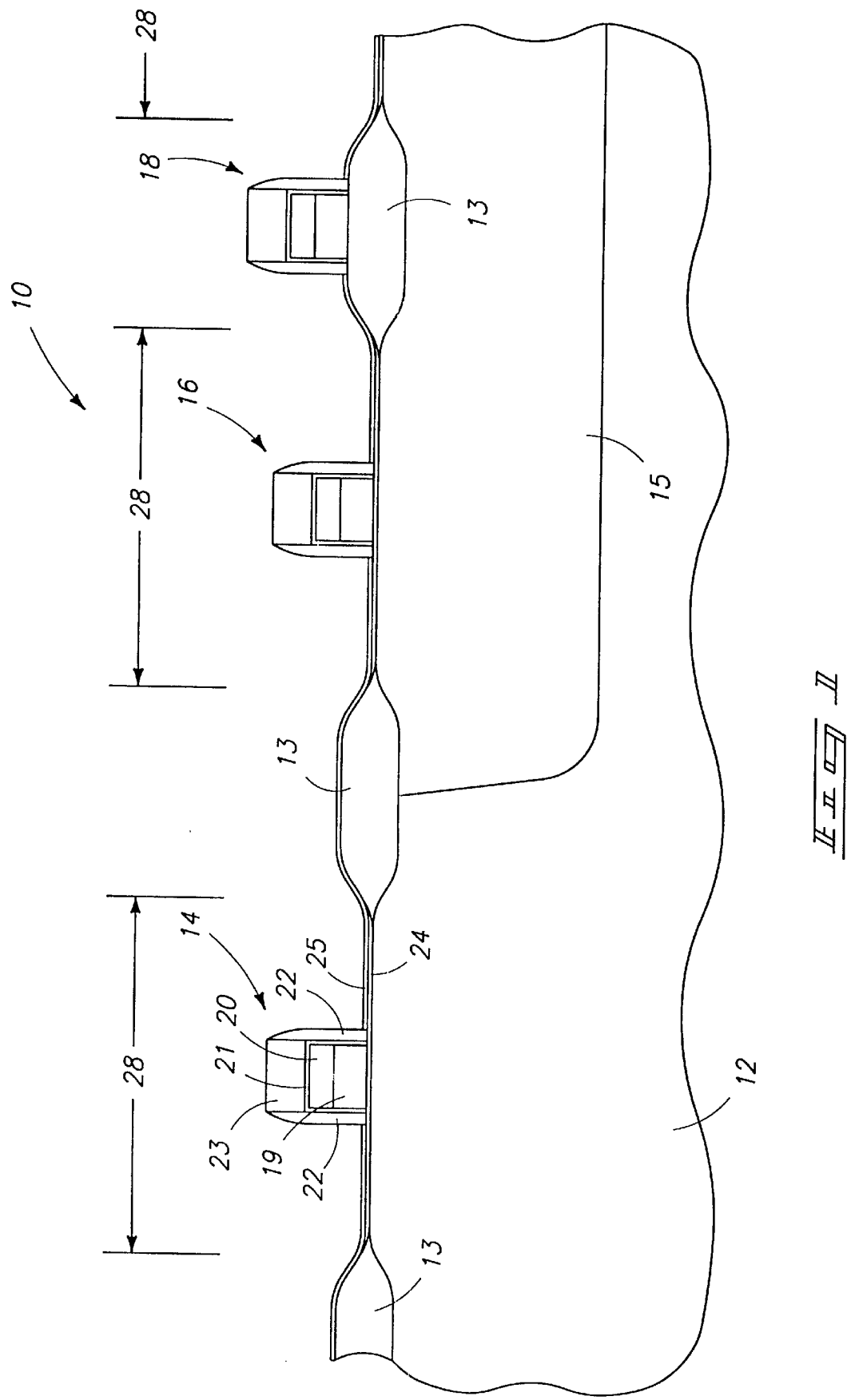
FIG. 1 is a diagrammatic sectional view of a semiconductor wafer fragment at one processing step in accordance with the invention.

This disclosure of the invention is submitted in furtherance of the constitutional purposes of the U.S. Patent Laws "to promote the progress of science and useful arts" (Article 1, Section 8).

In accordance with one aspect of the invention, a method of forming CMOS integrated circuitry comprises the following steps:

providing a series of field oxide regions and a series of gate lines over a semiconductor substrate, a first gate line being positioned relative to the substrate for formation of an NMOS transistor, a second gate line being positioned relative to the substrate for formation of a PMOS transistor;

providing an insulating dielectric layer over the field oxide regions and the gate lines, the insulating dielectric layer being provided to a thickness effective to provide an outer dielectric layer surface which is above the first and second gate lines;

patterning and etching the insulating dielectric layer to provide first openings therethrough to the substrate to define and expose active area adjacent one of the first or second gate lines for formation of one of PMOS type or NMOS type diffusion regions;

providing a first layer of conductive material over the insulating dielectric layer and within the first openings;

providing the one of PMOS or NMOS type diffusion regions within the substrate relative to the first openings;

patterning and etching the first layer of conductive material and the underlying insulating dielectric layer to provide second openings through both of the first layer of conductive material and the underlying insulating dielectric layer and to expose active area adjacent the other of the first or second gate lines for formation of the other of PMOS type or NMOS type diffusion regions;

providing a second layer of conductive material over the first layer of conductive material and within the second openings;

providing the other of PMOS or NMOS type diffusion regions within the substrate relative to the second openings; and in a common step, etching back the first and the second conductive layers to define electrically conductive projections which are isolated from one another within the first and the second openings.

In accordance with another aspect of the invention, a method of forming a field effect transistor comprises the following steps:

providing a gate over a semiconductor substrate, the gate having a thickness;

providing an insulating dielectric layer over the gate, the insulating dielectric layer being provided to a thickness which is greater than the gate thickness to provide an outer dielectric layer surface which is above the gate;

patterning and etching the insulating dielectric layer to provide openings therethrough to the substrate to define and expose active area adjacent the gate for formation of one of PMOS type or NMOS type diffusion regions;

providing a layer of conductive material over the insulating dielectric layer and within the openings;

providing the one of PMOS or NMOS type diffusion regions within the substrate relative to the first openings; and etching back the conductive layer to define electrically conductive projections which are isolated from one another within the openings.

More particularly, FIG. 1 illustrates a semiconductor wafer fragment in process indicated generally with reference numeral 10. Such comprises a bulk silicon substrate 12 and a series of field oxide regions 13. Field oxide regions can be recessed relative to substrate 12 if desired. Areas of the illustrated substrate 12 not covered by field oxide regions 13 constitute active area regions 28. A series of gate lines 14, 16 and 18 are provided over bulk substrate 12. Bulk substrate 12 is intrinsically doped with p-type material to an average dopant concentration of $10^{15}$–$10^{16}$ ions/cm$^3$. Gate line 14 constitutes a first gate line which is positioned relative to bulk substrate 12 for formation of an NMOS transistor. Gate line 16 constitutes a second gate line which is positioned relative to an n-well region 15 of bulk substrate 12 for formation of a PMOS transistor. Gate line 18 overlies the illustrated field oxide region 13 and, depending upon the circuit design out of the plane of the page upon which FIG. 1 lies, might overlie n-doped substrate or p-doped substrate for formation of PMOS or NMOS transistors, respectively. In the depicted embodiment, gate line 18 will be shown as connecting with n-type conductive material, such as might occur peripherally to a memory array.

The illustrated word lines conventionally comprise a conductively doped polysilicon region 19, an overlying $WSi_x$ layer 20, an encapsulating thin oxide layer 21, and nitride spacers 22 and nitride caps 23. Such layers are depicted with numerals only relative to word line 14 in FIG. 1 for clarity. An underlying sacrificial oxide layer 24 (i.e. 80 Angstroms) is provided, as well as an overlying thin nitride etch stop layer 25. At this point in the process, masking and p-channel halo or n-channel LDD implanting might be conducted, as well as $V_t$ implants. Such might be provided before or after provision of nitride spacers 22 and nitride cap 23.

Figure 2:
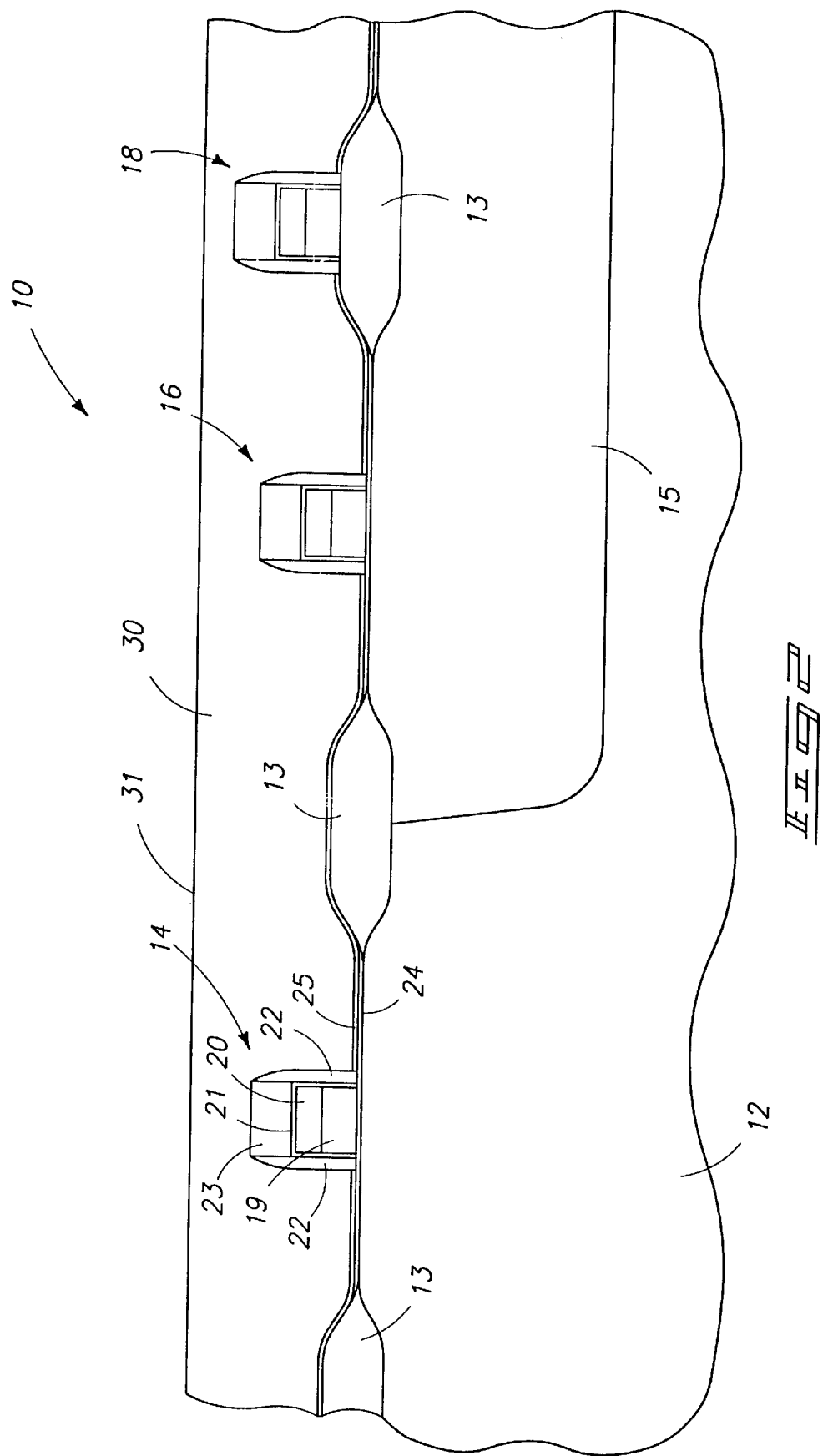
FIG. 2 is a view of the FIG. 1 wafer at a processing step subsequent to that shown by FIG. 1.

Referring to FIG. 2, a layer 30 of insulating dielectric is provided over field oxide regions 13 and gate lines 14, 16 and 18. Insulating dielectric layer 30 is provided to a thickness effective to provide an outer dielectric layer surface 31 which is above the illustrated gate lines. An example and preferred material for layer 30 is borophosphosilicate glass (BPSG) deposited to a thickness of 14,000 Angstroms. BPSG layer 30 is preferably subjected to a rapid thermal processing reflow step and optional CMP to provide outer layer 31 to be planar at this point in the process. Alternately, layer 30 could be provided and reflowed, but not chemical-mechanical polished, to be locally planar but globally unplanarized at this point in the process.

Figure 3:
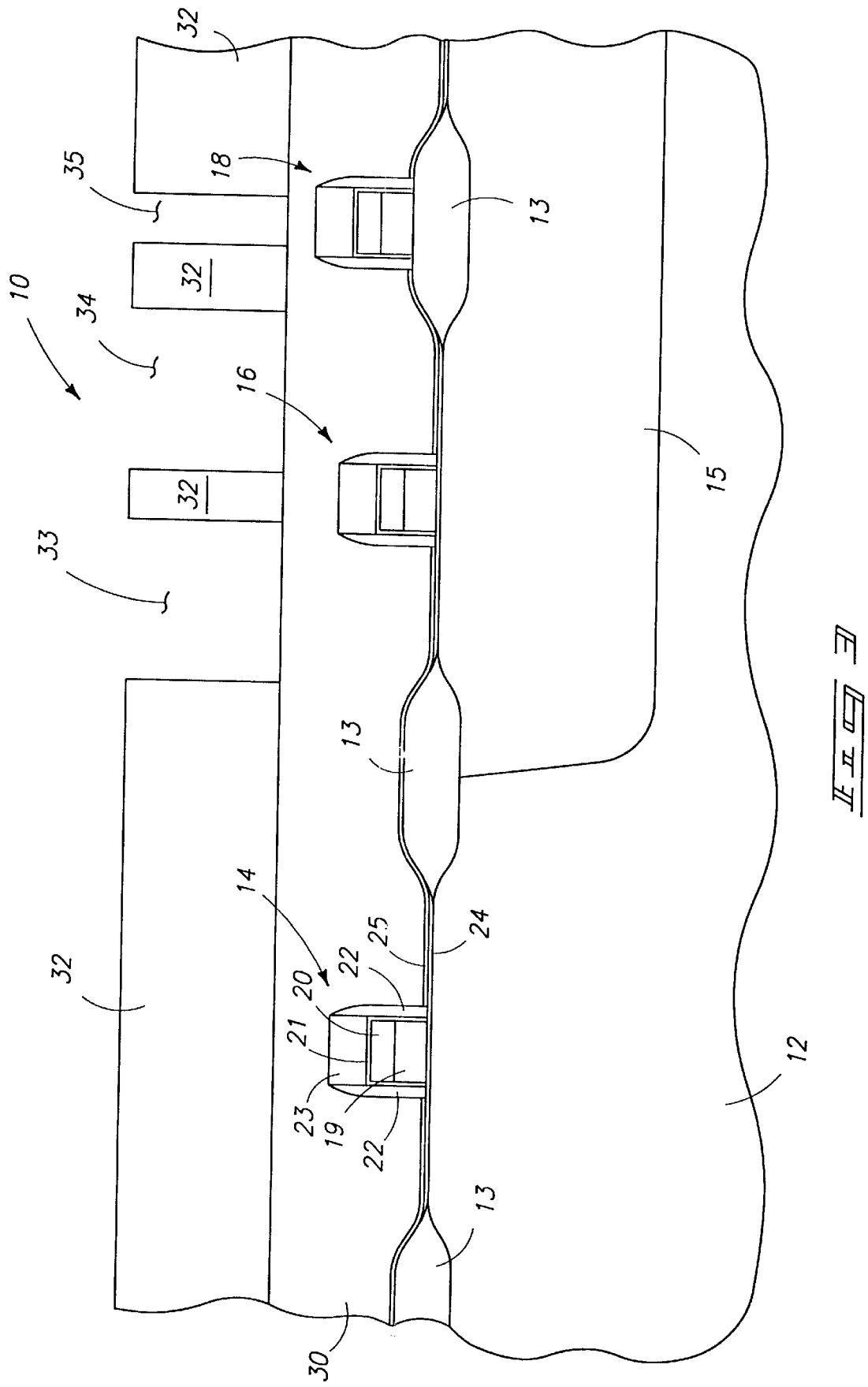
FIG. 3 is a view of the FIG. 1 wafer at a processing step subsequent to that shown by FIG. 2.

Referring to FIG. 3, a layer 32 of photoresist is deposited and patterned as shown to provide mask openings 33, 34 and 35.

Figure 4:
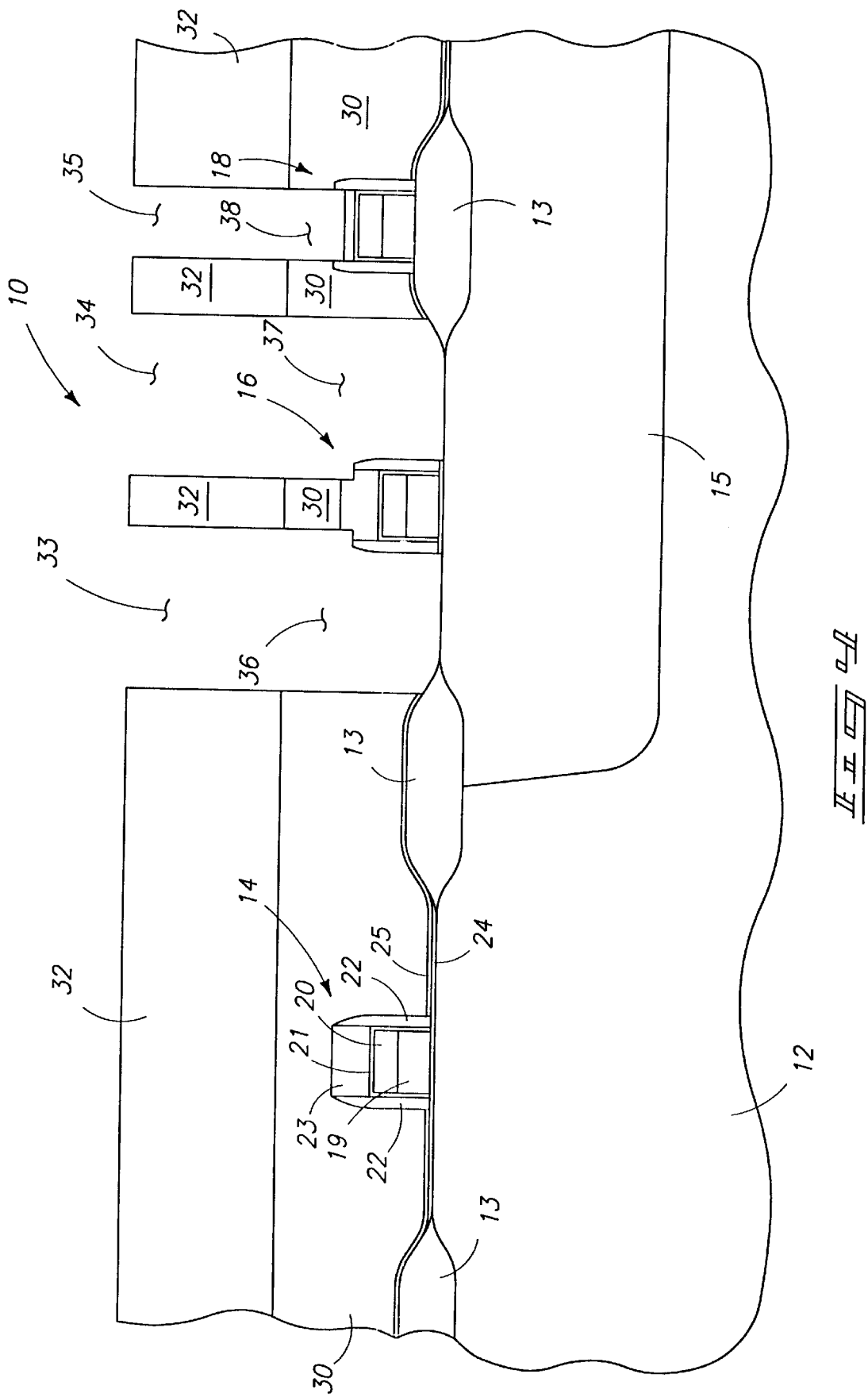
FIG. 4 is a view of the FIG. 1 wafer at a processing step subsequent to that shown by FIG. 3.

Referring to FIG. 4, insulating dielectric layer 30 is etched to provide first openings 36 and 37 therethrough to substrate/n-well 15 to define and expose active area adjacent second gate line 16 for formation of PMOS type diffusion regions. Mask openings 33 and 34 are advantageously provided to overlap on one side with nitride capped word line 16 and on the other sides overlap with the adjacent field oxide region 13. This advantageously outwardly exposes the essential entirety of the transistor active area which is not covered by gate line 16. Further, openings 33 and 34 (and correspondingly openings 36 and 37) are in the shape of elongated channels running perpendicular to the plane of the page upon which FIG. 4 lies, with the channels running along gate line 16 and over field oxide regions also located out of the plane of the page. The illustrated etch is conducted to remove nitride etch stop layer 25 and underlying oxide layer 24. Opening 38 is shown as an illustration for provision of a desired contact to gate line 18, which would most typically actually occur in an area of the substrate peripheral to an array containing gate lines 14 and 16 (i.e., out of the plane of the page upon which FIG. 4 lies). The subject nitride and oxide etches will etch a portion of the nitride cap of word line 18, as shown.

Figure 5:
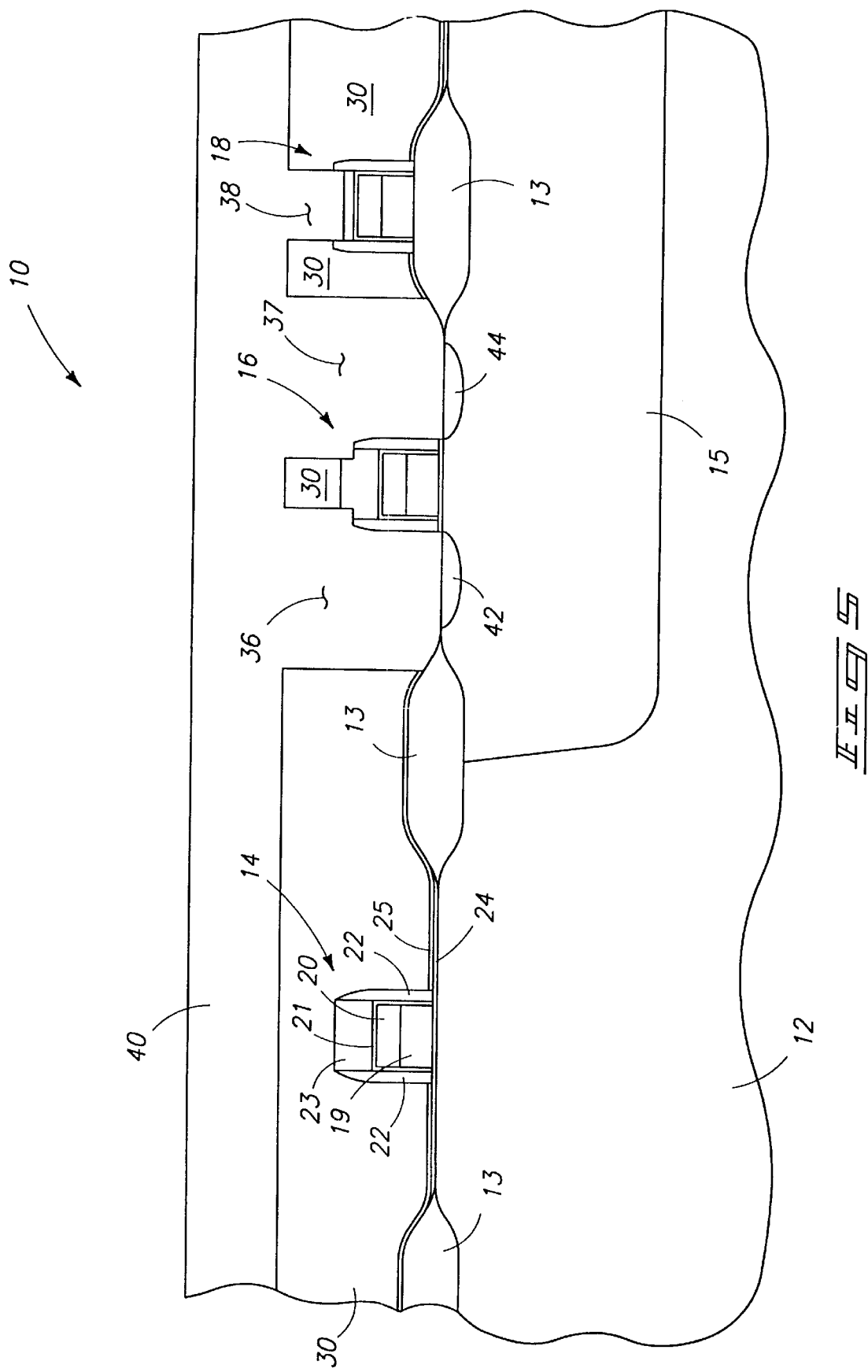
FIG. 5 is a view of the FIG. 1 wafer at a processing step subsequent to that shown by FIG. 4.

Referring to FIG. 5, a first layer 40 of electrically conductive material is provided over insulating dielectric layer 30 and within first openings 36, 37 and within opening 38. The preferred material for first layer 40 is conductively doped polysilicon having a p-type conductivity enhancing dopant concentration of at least $1 \times 10^{20}$ ions/cm$^3$. PMOS type diffusion regions 42 and 44 are provided within the substrate of n-well 15 relative to first openings 36 and 37. The preferred manner by which such regions 42 and 44 are provided is by out-diffusing the p-type conductivity enhancing dopant into substrate region 15 from conductively doped polysilicon first layer 40. Example conditions for producing regions 42 and 44 from polysilicon layer 40 include high temperature annealing, such as at 850° C. to 950° C. for thirty minutes. Most typically and preferably, wafer fragment 10 in the course of subsequent wafer processing will inherently be subjected to such high temperature annealing conditions such that a dedicated process step is not necessary for creating diffusion regions 42 and 44. Alternately, regions 42 and 44 might be provided by an ion implant or other diffusion relative to the FIG. 4 process step prior to the deposition of layer 40.

Figure 6:
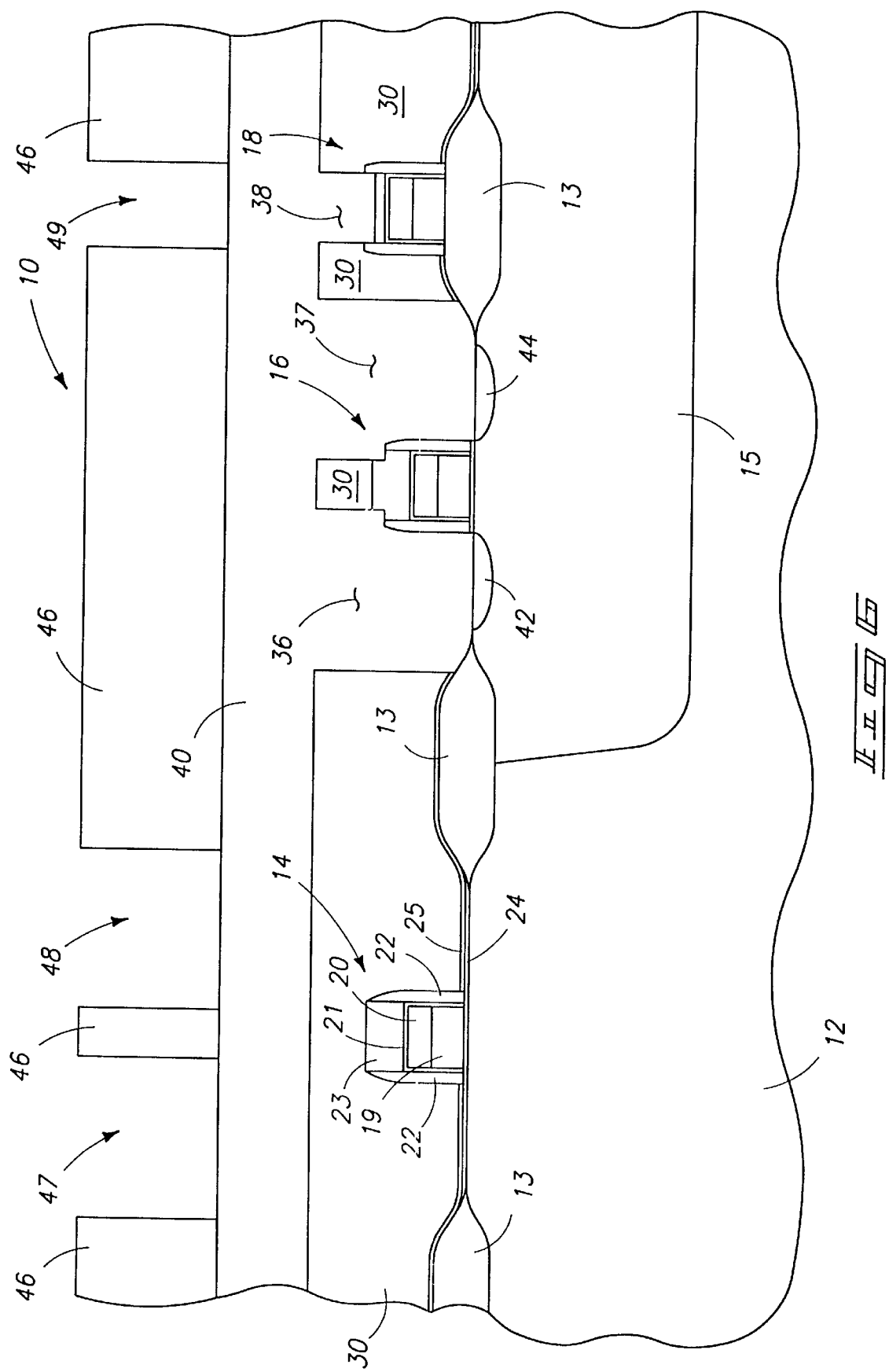
FIG. 6 is a view of the FIG. 1 wafer at a processing step subsequent to that shown by FIG. 5.

Referring to FIG. 6, another layer 46 of photoresist is deposited and patterned to define mask openings 47, 48 and 49.

Figure 7:
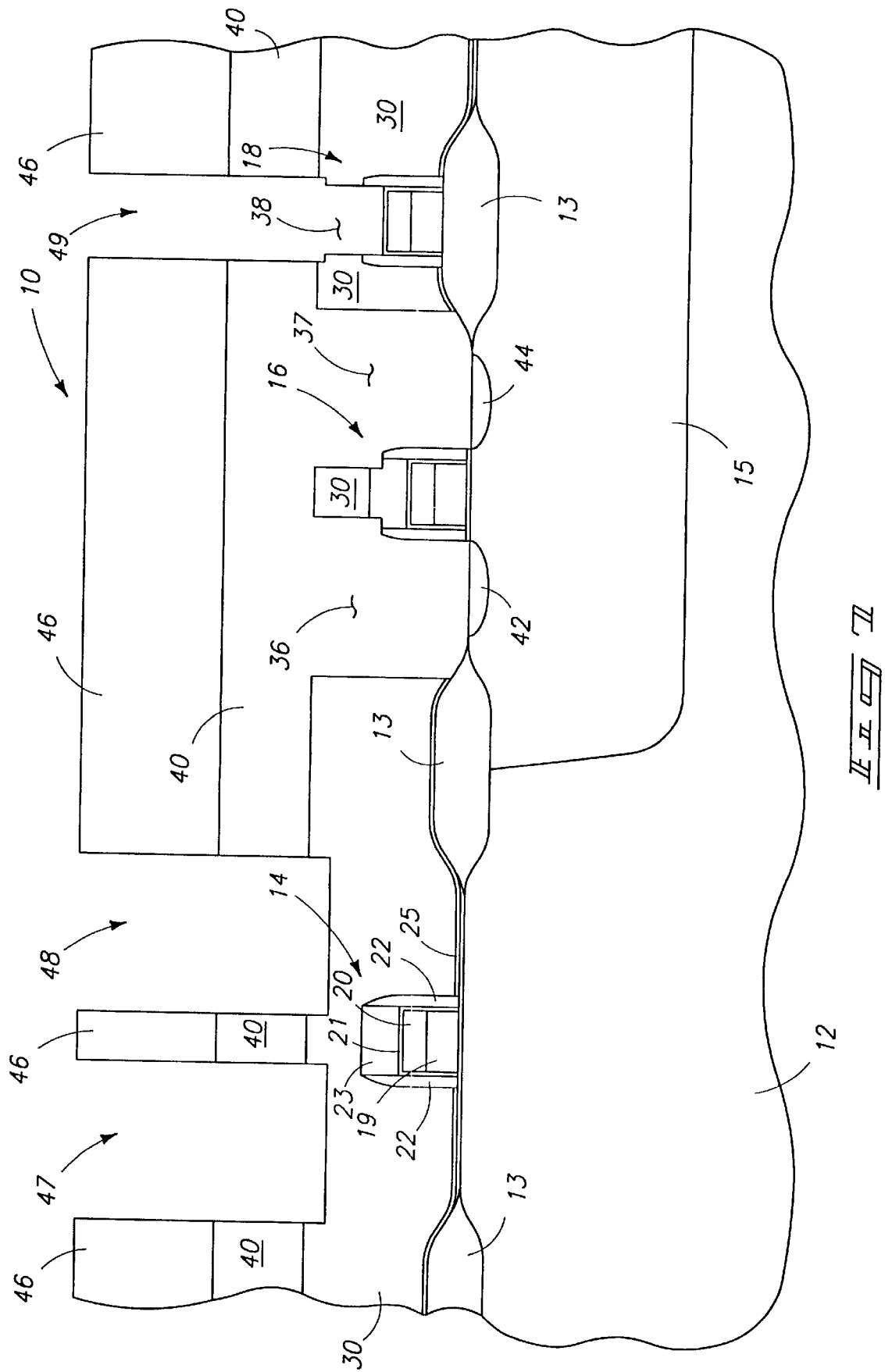
FIG. 7 is a view of the FIG. 1 wafer at a processing step subsequent to that shown by FIG. 6.

Referring to FIG. 7, first conductive layer 40 is etched selectively relative to underlying oxide, and then remaining nitride 23 within contact opening 49 is etched selectively relative to underlying oxide layer 21.

Figure 8:
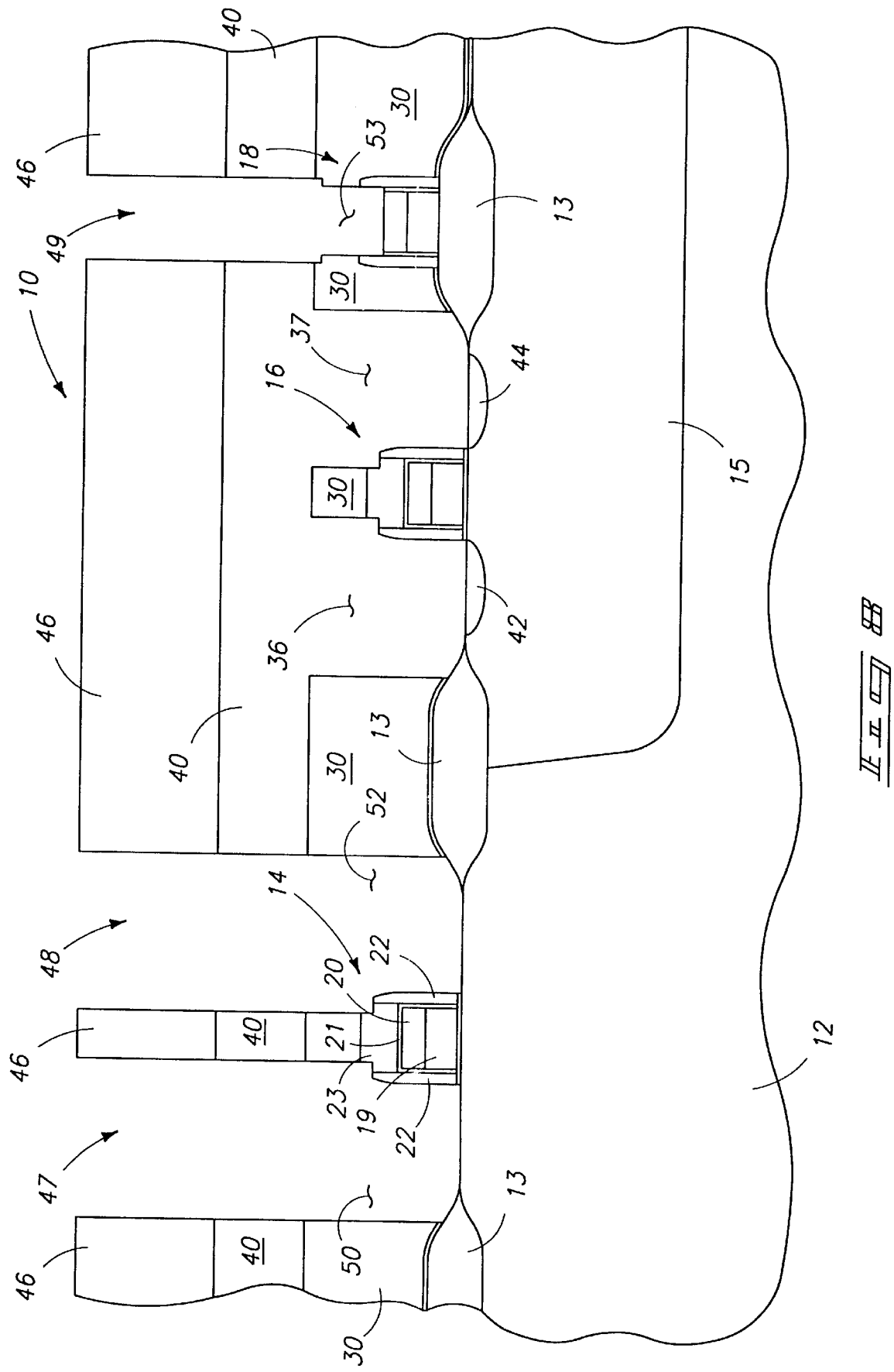
FIG. 8 is a view of the FIG. 1 wafer at a processing step subsequent to that shown by FIG. 7.

Referring to FIG. 8, underlying insulating dielectric layer 30 and then nitride is as well etched with the same mask to provide second openings 50 and 52, and opening 53, through conductive layer 40 and insulating dielectric layer 30 (in a selective manner relative to nitride) to expose active area adjacent first gate line 14 for formation of NMOS type diffusion regions. Mask openings 47 and 48 are again preferably provided to overlap with both word line 14 and adjacent field oxide regions 13, and are in the form of elongated channels. Accordingly, second openings 50 and 52 outwardly expose the essential entirety of the NMOS transistor active area not covered by gate line 14. Etching is ultimately conducted of the underlying nitride and oxide layers to outwardly expose substrate 12 and the conductive $WSi_x$ layer of gate line 18.

Figure 9:
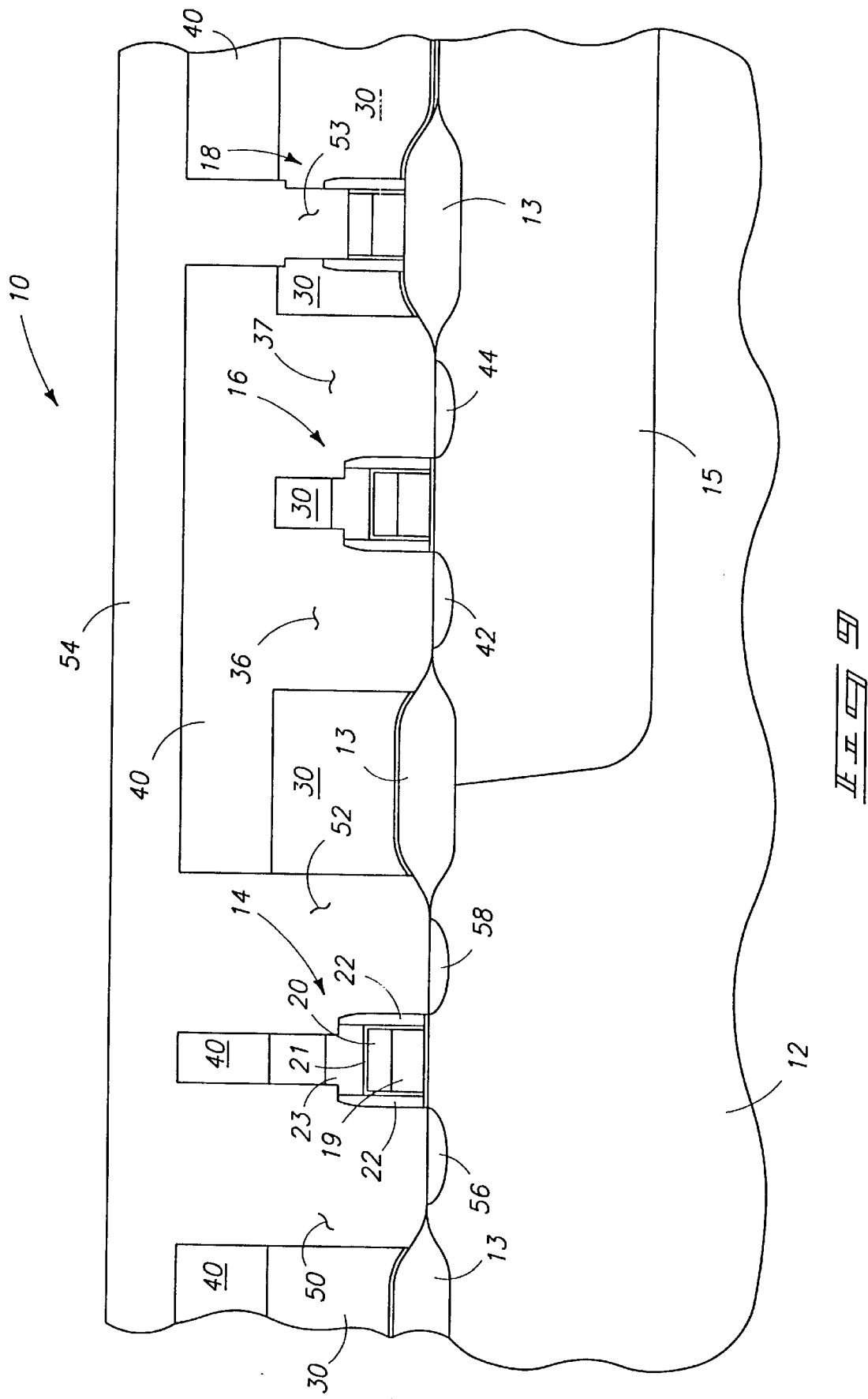
FIG. 9 is a view of the FIG. 1 wafer at a processing step subsequent to that shown by FIG. 8.

Referring to FIG. 9, the resist is stripped and a second layer 54 of conductive material is provided over first conductive material layer 40 and within second openings 50, 52, and opening 53. The preferred material for layer 54 is conductively doped polysilicon having an n-type conductivity enhancing dopant concentration of at least $1\times10^{20}$ ions/cm$^3$. N-type diffusion regions 56 and 58 are provided adjacent gate 14 for formation of an NMOS transistor. The preferred manner by which such diffusion regions are provided is by out-diffusing the n-type conductivity enhancing dopant into substrate 12 from n-type conductively doped polysilicon second layer 54. Such can be provided by a separate anneal step, or by inherent subsequent wafer processing as described above with respect to the preferred manner by which PMOS diffusion regions 42 and 44 were provided. With such out-diffusing whether by a dedicated step or inherent subsequent wafer processing, the p-type and n-type out-diffusion preferably is conducted simultaneously. Also, diffusion regions 56 and 58 might be provided by an ion implant or other diffusion at the processing step of FIG. 8 and prior to provision of conductive layer 54.

Figure 10:
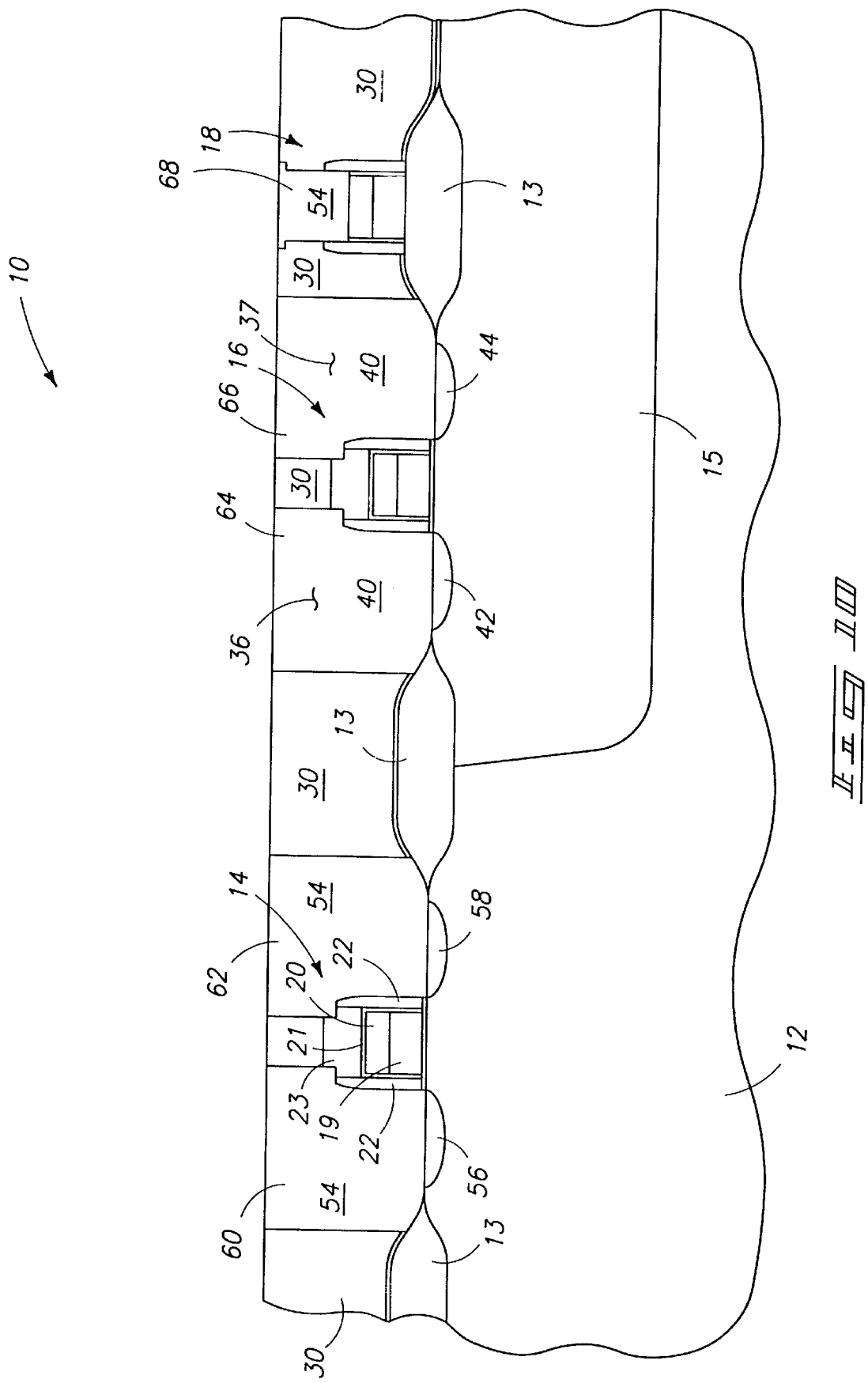
FIG. 10 is a view of the FIG. 1 wafer at a processing step subsequent to that shown by FIG. 9.

Referring to FIG. 10, second conductive layer 54 and first conductive layer 40 are etched back in a common step to define electrically conductive projections 60, 62, 64, 66 and 68 which are isolated from one another within their respective openings. The preferred common step etching back method is by chemical-mechanical polishing. Although in the illustrated and described embodiment surface 31 of insulating dielectric layer 30 was previously planarized, such layer can be unplanarized prior to the common etching step of conductive layers 54 and 40.

Figure 11:
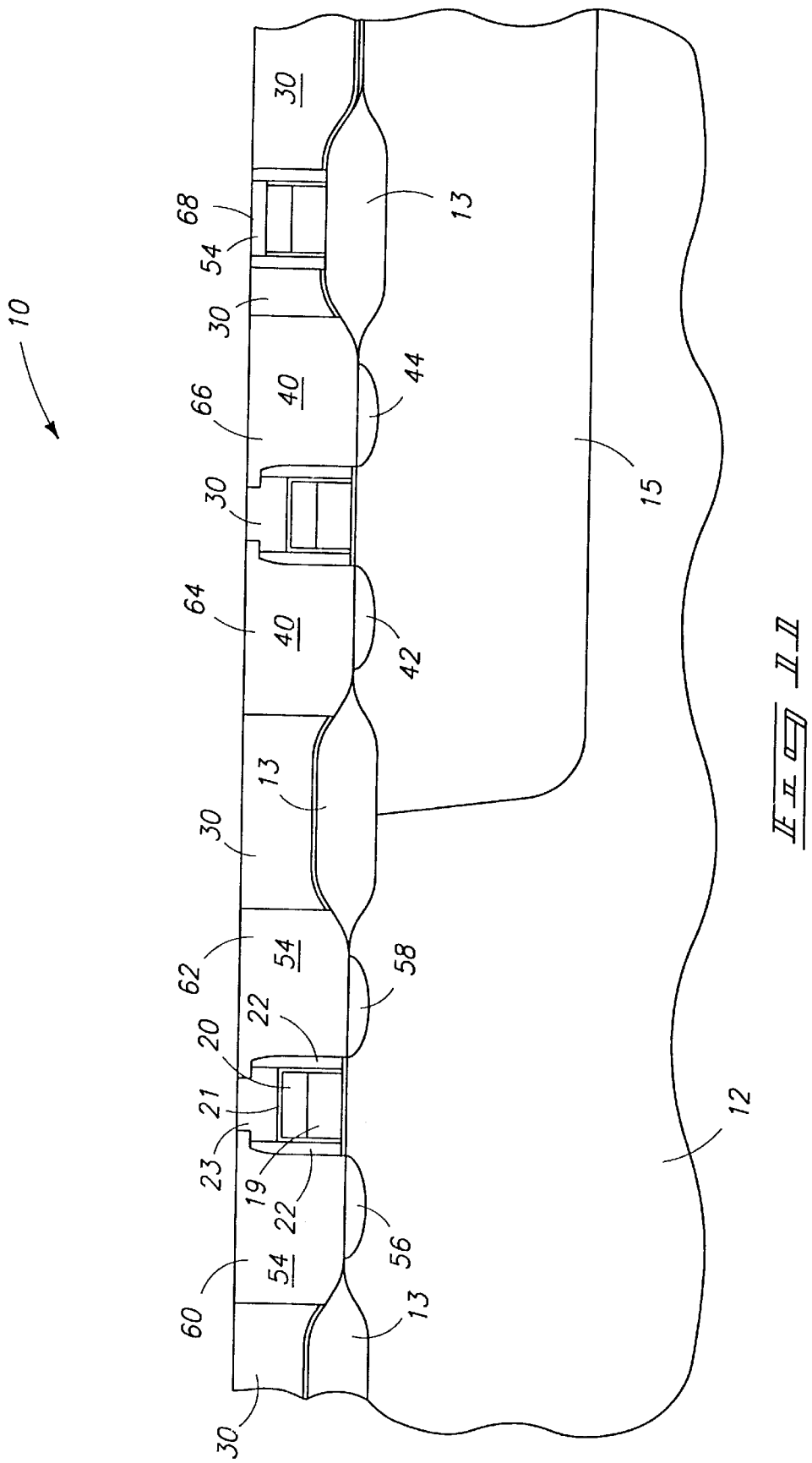
FIG. 11 is a view of the FIG. 1 wafer at a processing step is subsequent to that shown by FIG. 10.

Referring to FIG. 11, the chemical-mechanical polishing step can and also includes substantial etching of insulating dielectric layer 30 in a manner which utilizes the nitride caps 23 of the illustrated word lines as an etch stop.

The above process provides an advantage of enabling elimination of prior art deep n+ and p+ contacts, and the associated problems created by the high aspect ratios of deep contacts. The above process also enables an advantage of eliminating metal to bulk silicon contacts for diffusion regions. Such further provides improved packing density without necessitating n+/p+ surround of contacts.

Subsequent layers would be deposited and patterned to provide associated capacitors with respect to one of the diffusion regions of each transistor, with bit line connections to the other diffusion regions of the respective transistors. The above described process has its greatest advantages in the formation of CMOS circuitry. However, the artisan will appreciate that aspects of the invention would also be applicable to formation of only one of NMOS or PMOS type field effect transistors.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A method of forming CMOS integrated circuitry comprising the following steps:

providing a series of gate lines over a semiconductor substrate, a first gate line being positioned relative to the substrate for formation of an NMOS transistor, a second gate line being positioned relative to the substrate for formation of a PMOS transistor, defining PMOS type diffusion region node locations within the substrate proximate the PMOS transistor, defining NMOS type diffusion region node locations within the substrate proximate the NMOS transistor;

forming an insulating dielectric layer over the gate lines;

forming first openings through the insulating dielectric layer to proximate one of the PMOS type or NMOS type diffusion region node locations;

forming a first layer of conductive material over the insulating dielectric layer and within the first openings;

forming second openings through both of the first layer of conductive material and the underlying insulating dielectric layer to proximate the other of the PMOS type or NMOS type diffusion region node locations;

forming a second layer of conductive material over the first layer of conductive material and within the second openings;

in a common step, etching back the first and the second conductive layers to define electrically conductive projections which are isolated from one another within the first and the second openings; and the common step including etching of the insulating dielectric layer, the first gate line and the second gate line being covered with nitride caps, the common step comprising chemical-mechanical polishing of the insulating dielectric layer and using the nitride caps as an etch stop.

2. A method of forming CMOS integrated circuitry comprising the following steps:

providing a series of gate lines over a semiconductor substrate, a first gate line being positioned relative to the substrate for formation of an NMOS transistor, a second gate line being positioned relative to the substrate for formation of a PMOS transistor, defining PMOS type diffusion region node locations within the substrate proximate the PMOS transistor, defining NMOS type diffusion region node locations within the substrate proximate the NMOS transistor;

forming an insulating dielectric layer over the gate lines;

forming first openings through the insulating dielectric layer to proximate one of the PMOS type or NMOS type diffusion region node locations;

forming a first layer of conductive material over the insulating dielectric layer and within the first openings;

forming second openings through both of the first layer of conductive material and the underlying insulating dielectric layer to proximate the other of the PMOS type or NMOS type diffusion region node locations;

forming a second layer of conductive material over the first layer of conductive material and within the second openings; and the first layer of conductive material comprising conductively doped polysilicon having a conductivity enhancing dopant concentration of at least $1\times10^{20}$ ions/cm$^3$, the method further comprising out-diffusing the conductivity enhancing dopant into the substrate from the conductively doped polysilicon of the first layer to form the one of the PMOS type or NMOS type diffusion regions within the substrate.

3. A method of forming CMOS integrated circuitry comprising the following steps:

providing a series of gate lines over a semiconductor substrate, a first gate line being positioned relative to the substrate for formation of an NMOS transistor, a second gate line being positioned relative to the substrate for formation of a PMOS transistor, defining PMOS type diffusion region node locations within the substrate proximate the PMOS transistor, defining NMOS type diffusion region node locations within the substrate proximate the NMOS transistor;

forming an insulating dielectric layer over the gate lines;

forming first openings through the insulating dielectric layer to proximate one of the PMOS type or NMOS type diffusion region node locations;

forming a first layer of conductive material over the insulating dielectric layer and within the first openings;

forming second openings through both of the first layer of conductive material and the underlying insulating dielectric layer to proximate the other of the PMOS type or NMOS type diffusion region node locations;

forming a second layer of conductive material over the first layer of conductive material and within the second openings; and the second layer of conductive material comprising conductively doped polysilicon having a conductivity enhancing dopant concentration of at least $1 \times 10^{20}$ ions/cm$^3$, the method further comprising out-diffusing the conductivity enhancing dopant into the substrate from the conductively doped polysilicon of the second layer to form the other of the PMOS type or NMOS type diffusion regions within the substrate.

4. A method of forming CMOS integrated circuitry comprising the following steps:

providing a series of gate lines over a semiconductor substrate, a first gate line being positioned relative to the substrate for formation of an NMOS transistor, a second gate line being positioned relative to the substrate for formation of a PMOS transistor, defining PMOS type diffusion region node locations within the substrate proximate the PMOS transistor, defining NMOS type diffusion region node locations within the substrate proximate the NMOS transistor;

forming an insulating dielectric layer over the gate lines;

forming first openings through the insulating dielectric layer to proximate one of the PMOS type or NMOS type diffusion region node locations;

forming a first layer of conductive material over the insulating dielectric layer and within the first openings;

forming second openings through both of the first layer of conductive material and the underlying insulating dielectric layer to proximate the other of the PMOS type or NMOS type diffusion region node locations;

forming a second layer of conductive material over the first layer of conductive material and within the second openings; and the first layer of conductive material comprising conductively doped polysilicon having a conductivity enhancing dopant concentration of at least $1 \times 10^{20}$ ions/cm$^3$, the second layer of conductive material comprising conductively doped polysilicon having a conductivity enhancing dopant concentration of at least $1 \times 10^{20}$ ions/cm$^3$, the method further comprising:

out-diffusing the conductivity enhancing dopant into the substrate from the conductively doped polysilicon of the first layer to form the one of the PMOS type or NMOS type diffusion regions within the substrate;

out-diffusing the conductivity enhancing dopant into the substrate from the conductively doped polysilicon of the second layer to form the other of the PMOS type or NMOS type diffusion regions within the substrate; and the out-diffusing from the conductively doped polysilicon of the first and second layers occurring simultaneously.

* * * * *